US012620956B2

(12) United States Patent
Matsuo et al.

(10) Patent No.: US 12,620,956 B2
(45) Date of Patent: May 5, 2026

(54) METHOD FOR MANUFACTURING RESONATOR ELEMENT AND RESONATOR ELEMENT ASSEMBLY

(71) Applicant: SEIKO EPSON CORPORATION, Tokyo (JP)

(72) Inventors: Atsushi Matsuo, Shiojiri (JP); Kensaku Isohata, Minowa-machi (JP); Masaya Kanno, Okaya (JP)

(73) Assignee: SEIKO EPSON CORPORATION, Tokyo (JP)

( * ) Notice: Subject to any disclaimer, the term of this patent is extended or adjusted under 35 U.S.C. 154(b) by 811 days.

(21) Appl. No.: 18/081,946

(22) Filed: Dec. 15, 2022

(65) Prior Publication Data

US 2023/0198489 A1     Jun. 22, 2023

(30) Foreign Application Priority Data

Dec. 17, 2021     (JP) ................................. 2021-204880

(51) Int. Cl.
| | |
|---|---|
| *H03H 3/00* | (2006.01) |
| *H03H 3/02* | (2006.01) |
| *H03H 9/19* | (2006.01) |

(52) U.S. Cl.
CPC ................ H03H 3/02 (2013.01); H03H 9/19 (2013.01)

(58) Field of Classification Search
CPC ......... H03H 3/02; H03H 9/19; H03H 9/02157
See application file for complete search history.

(56) References Cited

U.S. PATENT DOCUMENTS

2016/0226465 A1*   8/2016   Yamashita ......... H03H 9/02062

FOREIGN PATENT DOCUMENTS

JP           2007-142995 A      6/2007

* cited by examiner

*Primary Examiner* — Julio C. Gonzalez
(74) *Attorney, Agent, or Firm* — Rankin, Hill & Clark LLP

(57)          ABSTRACT

A method for manufacturing a resonator element includes: a substrate preparation step of preparing a substrate; an etching step of performing an etching process on the substrate to form a resonator element, a frame portion, and a holding portion that couples the resonator element and the frame portion; and a break-off step of breaking off the resonator element from the frame portion. The holding portion includes a narrow portion in which a part of a width is narrow. The width of the narrow portion is minimum at a position closer to a resonator element side than at a center of the holding portion. In a cross-sectional view, an angle formed by a side surface of the narrow portion with respect to a flat surface of the holding portion is in a range of 85° or more and 95° or less. The etching process is dry etching.

14 Claims, 9 Drawing Sheets

METHOD FOR MANUFACTURING RESONATOR ELEMENT AND RESONATOR ELEMENT ASSEMBLY

The present application is based on, and claims priority from JP Application Serial Number 2021-204880, filed Dec. 17, 2021, the disclosure of which is hereby incorporated by reference herein in its entirety.

BACKGROUND

1. Technical Field

The present disclosure relates to a method for manufacturing a resonator element and a resonator element assembly.

2. Related Art

As a method for manufacturing a piezoelectric resonator element used in a piezoelectric device, for example, JP-A-2007-142995 discloses a method for manufacturing a piezoelectric resonator element by wet etching a quartz crystal wafer by a photolithography method to form an element piece assembly and then breaking off element pieces to be individual resonator elements from a quartz crystal frame.

However, in the element piece broken off from the quartz crystal frame disclosed in JP-A-2007-142995, a progress rate of etching by a crystal axis orientation is different due to etching anisotropy of the quartz crystal accompanying the wet etching. Therefore, a crack which is a portion that becomes an inclined surface in a cross-sectional view is generated on one side of a support portion, and no crack is generated on the other side. In this case, stress is concentrated on both ends of the crack at the time of breaking off on the side where the crack can be generated. Therefore, it is not possible to control on which side of the crack the breaking off is performed, and a shape of the support portion after the breaking off may vary.

SUMMARY

A method for manufacturing a resonator element includes: a substrate preparation step of preparing a substrate; an etching step of performing an etching process on the substrate to form a resonator element, a frame portion, and a holding portion that couples the resonator element and the frame portion; and a break-off step of breaking off the resonator element from the frame portion. The holding portion includes a narrow portion in which a part of a width is narrow. The width of the narrow portion is minimum at a position closer to a resonator element side than at a center of the holding portion. In a cross-sectional view, an angle formed by a side surface of the narrow portion with respect to a flat surface of the holding portion is in a range of 85° or more and 95° or less. The etching process is dry etching.

A resonator element assembly includes: a resonator element; a frame portion; and a holding portion that couples the resonator element and the frame portion. The holding portion includes a narrow portion in which a part of a width is narrow. The width of the narrow portion is minimum at a position closer to a resonator element side than at a center of the holding portion. In a cross-sectional view, an angle formed by a side surface of the narrow portion with respect to a flat surface of the holding portion is in a range of 85° or more and 95° or less.

DESCRIPTION OF EXEMPLARY EMBODIMENTS

1. First Embodiment

1.1. Resonator Element Assembly

Figure 1:
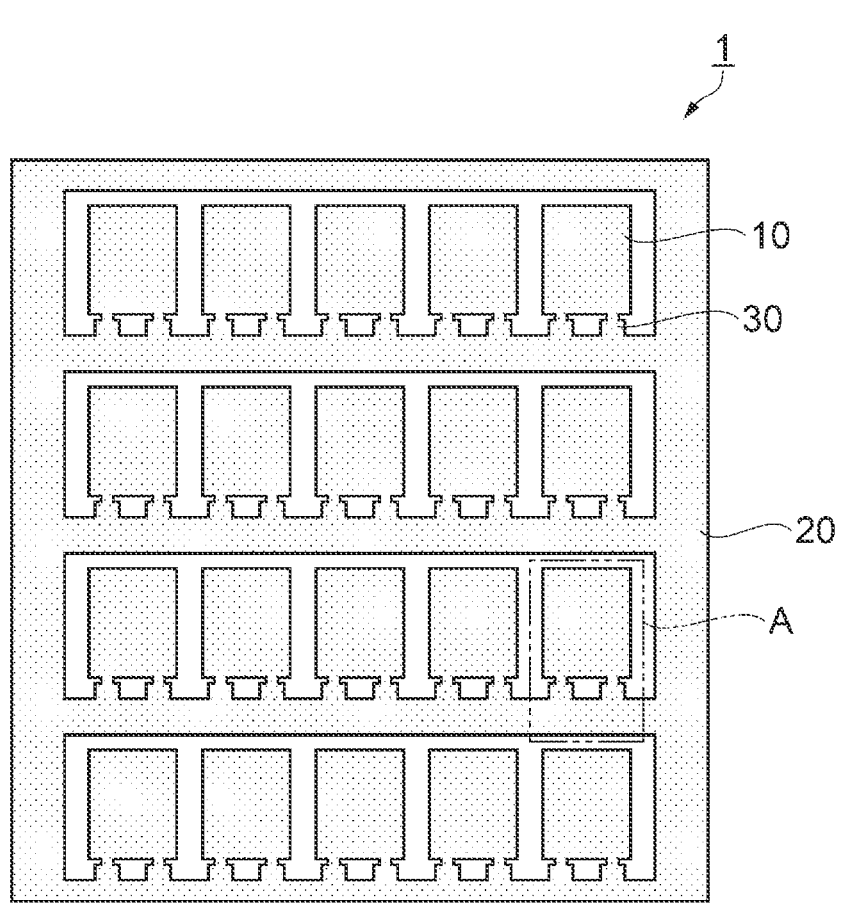
FIG. 1 is a plan view showing a schematic configuration of a resonator element assembly according to a first embodiment.
Figure 1:
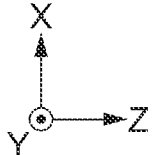

First, a resonator element assembly 1 according to a first embodiment will be described with reference to FIGS. 1, 2, and 3.

For convenience of description, in the following drawings except for FIG. 4, an X axis, a Y axis, and a Z axis are shown as three axes orthogonal to one another. A direction along the X axis is referred to as an "X direction". A direction along the Y axis is referred to as a "Y direction". A direction along the Z axis is referred to as a "Z direction". An arrow side of each axis is also referred to as a "plus side". A side opposite to the arrow side is referred to as a "minus side".

The resonator element assembly 1 according to the present embodiment is capable of thickness-shear resonation, and includes various piezoelectric substrates such as quartz crystal. Typically, the crystal substrate is an AT cut quartz crystal substrate or an SC cut quartz crystal substrate. In the present embodiment, the AT cut quartz crystal substrate will be described as an example. Therefore, the X axis, the Y axis, and the Z axis in the drawings correspond to the X axis, a Y' axis, and a Z' axis, respectively, which are crystal axes of the quartz crystal.

As shown in FIG. 1, the resonator element assembly 1 includes a resonator element 10, a frame portion 20, and holding portions 30 that couple the resonator element 10 and the frame portion 20. The resonator element assembly 1 includes a plurality of resonator elements 10, one frame portion 20, and a plurality of holding portions 30 that couple the resonator elements 10 to the frame portion 20.

The resonator element 10 is a rectangular flat plate having the X direction as a longitudinal direction and the Z direction as a width direction. An end portion 11 of the resonator element 10 on the minus side in the X direction is coupled to the frame portion 20 via the holding portions 30. The resonator element 10 can be resonated as an AT cut resonator element by forming excitation electrodes on front and back surfaces of a principal surface.

The frame portion 20 couples the plurality of resonator elements 10 at one or more coupling portions each including two holding portions 30, and prevents the resonator elements 10 from being singulated during an etching process.

Figure 2:
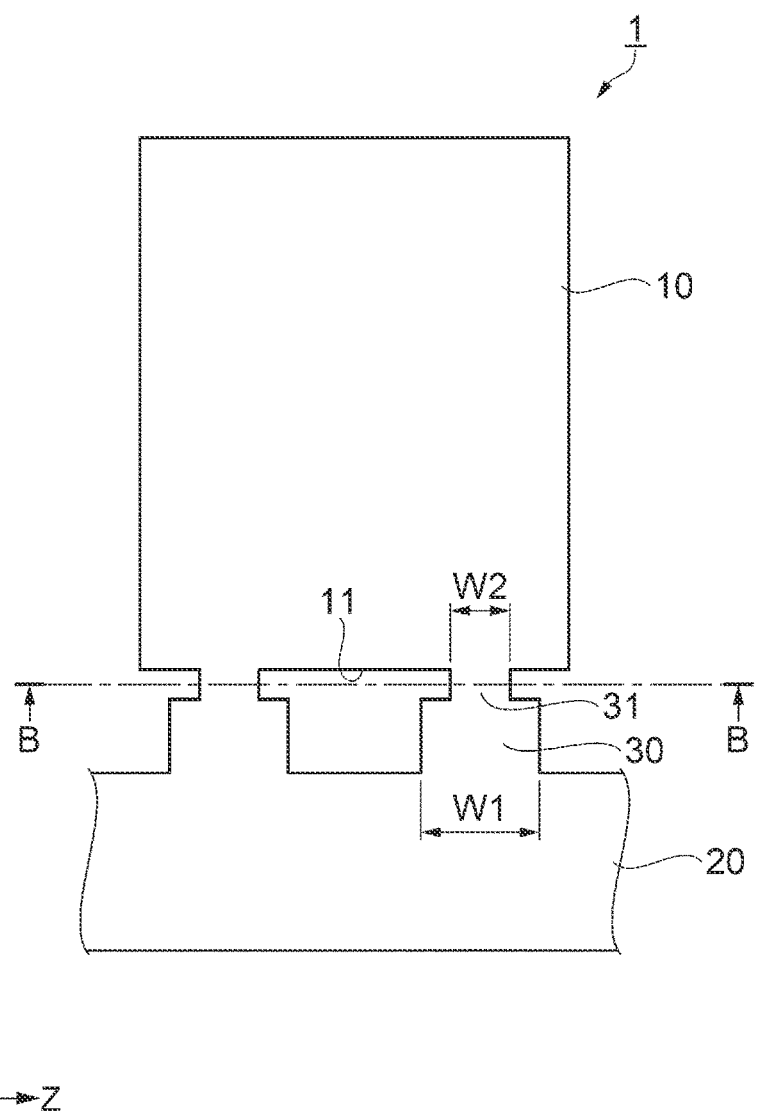
FIG. 2 is an enlarged view of a portion A in FIG. 1.

As shown in FIG. 2, the holding portions 30 extend from the frame portion 20 to the plus side in the X direction and are coupled to the end portion 11 of the resonator element 10. The holding portion 30 includes a narrow portion 31 at which a part of a width W1 is narrow. A width W2 of the narrow portion 31 is minimum at a position closer to a resonator element 10 side than at a center of the holding portion 30. In the present embodiment, the position where the width W2 of the narrow portion 31 is minimum is the end portion 11 of the resonator element 10.

Figure 3:
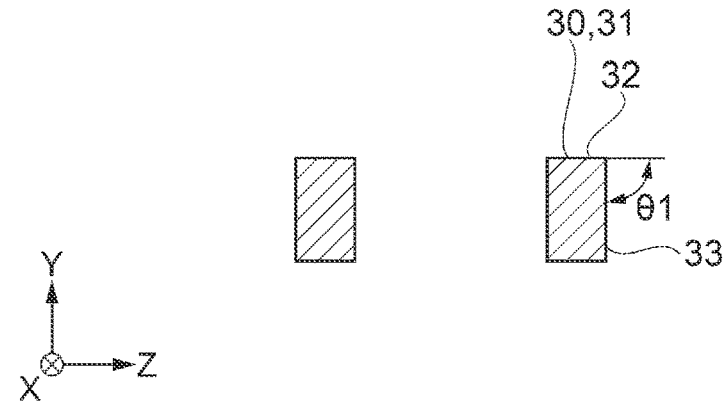
FIG. 3 is a cross-sectional view taken along a line B-B in FIG. 2.

As shown in FIG. 3, in a cross-sectional view, an angle θ1 formed by a side surface 33 of the narrow portion 31 with respect to a flat surface 32 of the holding portion 30 is substantially a right angle, and is within a range of 90°±5°, in other words, within a range of 85° or more and 95° or less. This is because the resonator element assembly 1 is formed by dry etching.

Therefore, since a crack is not caused in the holding portion 30 due to the wet etching, the stress when the resonator element 10 is broken off from the frame portion 20 is concentrated on the narrow portion 31, and it is possible to reduce variation in a shape of the holding portion 30 after the breaking off. In the present embodiment, since the position where the width W2 of the narrow portion 31 is minimum is the end portion 11 of the resonator element 10, the stress at the time of the breaking off is concentrated on the end portion 11 of the resonator element 10 which is a minimum width of the narrow portion 31, and it is possible to obtain the resonator element 10 with no residue of the holding portion 30 after the breaking off.

As described above, the resonator element assembly 1 according to the present embodiment includes the narrow portion 31 in the holding portion 30 that couples the resonator element 10 and the frame portion 20, and the width W2 in the narrow portion 31 is minimum at the position closer to the resonator element 10 side than at the center of the holding portion 30. The angle θ1 formed by the side surface 33 of the narrow portion 31 with respect to the flat surface 32 of the holding portion 30 is in the range of 85° or more and 95° or less. Therefore, the stress when the resonator element 10 is broken off from the frame portion 20 is concentrated on the narrow portion 31, and it is possible to reduce the variation in the shape of the holding portion 30 after the breaking off. Therefore, frequency variation of unnecessary resonation due to an outer shape of the resonator element 10 can be reduced, and the influence of the unnecessary resonation can be made less likely to be received, so that an AT cut resonator element having stable resonation characteristics can be obtained.

1.2. Method for Manufacturing Resonator Element

Next, a method for manufacturing the resonator element 10 according to the present embodiment will be described with reference to FIG. 4.

Figure 4:
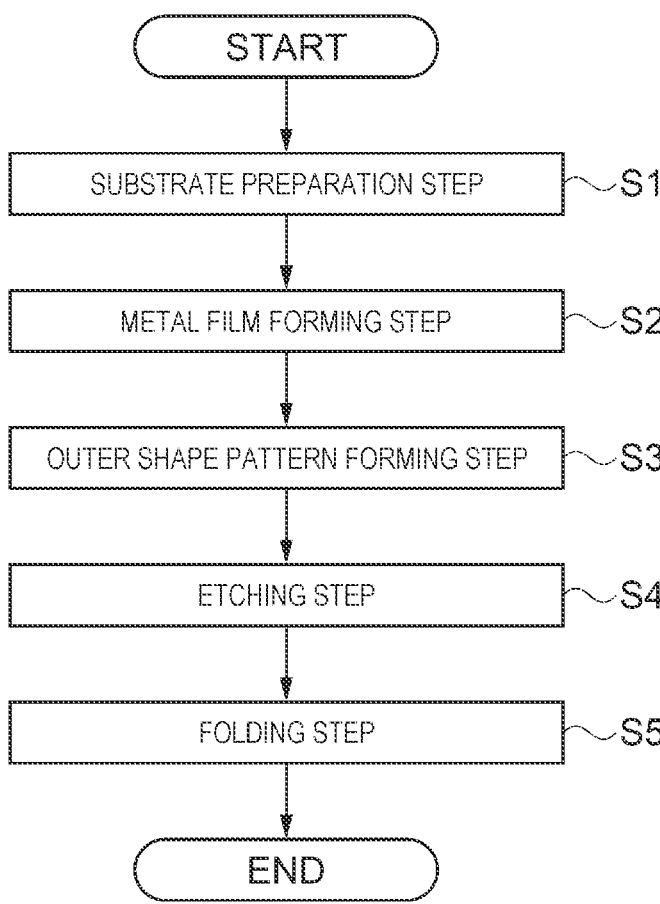
FIG. 4 is a flowchart showing a method for manufacturing a resonator element.

As shown in FIG. 4, the method for manufacturing the resonator element 10 according to the present embodiment includes a substrate preparation step, a metal film forming step, an outer shape pattern forming step, an etching step, and a break-off step.

1.2.1. Substrate Preparation Step

First, in step S1, a substrate made of a piezoelectric material, typically an AT cut quartz crystal substrate or an SC cut quartz crystal substrate, is prepared.

1.2.2. Metal Film Forming Step

In step S2, a metal film of gold or the like is formed on the entire surface of the substrate by a sputtering device, a vapor deposition device, or the like. The metal film functions as a protective film of the substrate in the etching step to be described later.

1.2.3. Outer Shape Pattern Forming Step

In step S3, the entire surface of the substrate on which the metal film is formed is coated with a resist by a spray type or spin type resist coating device. Thereafter, a photomask is disposed on the substrate coated with the resist, and the substrate is exposed to light. The resist is developed, and the metal film exposed from the resist is etched to form an outer shape pattern including the resonator element 10, the frame portion 20, the holding portion 30, and the like. The holding portion 30 includes the narrow portion 31 at which a part of the width W1 is narrow. The width W2 of the narrow portion 31 is minimum at the position closer to the resonator element 10 side than at the center of the holding portion 30.

1.2.4. Etching Step

In step S4, the etching process by dry etching is performed on a portion where the substrate other than the outer shape pattern is exposed by a reactive ion etching device or the like, and the resonator element assembly 1 including the resonator elements 10 coupled to the frame portion 20 by the holding portions 30 is formed. Since the etching process is performed by the dry etching, the angle θ1 formed by the side surface 33 of the narrow portion 31 with respect to the flat surface 32 of the holding portion 30 can be set within the range of 90°±5°, in other words, within the range of 85° or more and 95° or less.

1.2.5. Break-Off Step

In step S5, the resonator element 10 is broken off from the frame portion 20 and singulated, thereby completing the resonator element 10.

As described above, since the method for manufacturing the resonator element 10 according to the present embodiment is manufacturing by the dry etching in the etching process, the angle θ1 formed by the side surface 33 of the narrow portion 31 with respect to the flat surface 32 of the holding portion 30 can be set within the range of 85° or more and 95° or less, the stress when the resonator element 10 is broken off from the frame portion 20 can be concentrated at the position where the width W2 of the narrow portion 31 is minimum, and it is possible to reduce the variation in the shape of the holding portion 30 after the breaking off.

Although omitted in the above description, the method for manufacturing the resonator element 10 according to the present embodiment may include an electrode film forming step between the etching step and the break-off step. In the electrode film forming step, a metal film for an electrode is formed on the resonator element assembly 1, and then a part of the metal film is removed to form a pattern of an excitation electrode and an extraction electrode.

2. Second Embodiment

Figure 5:
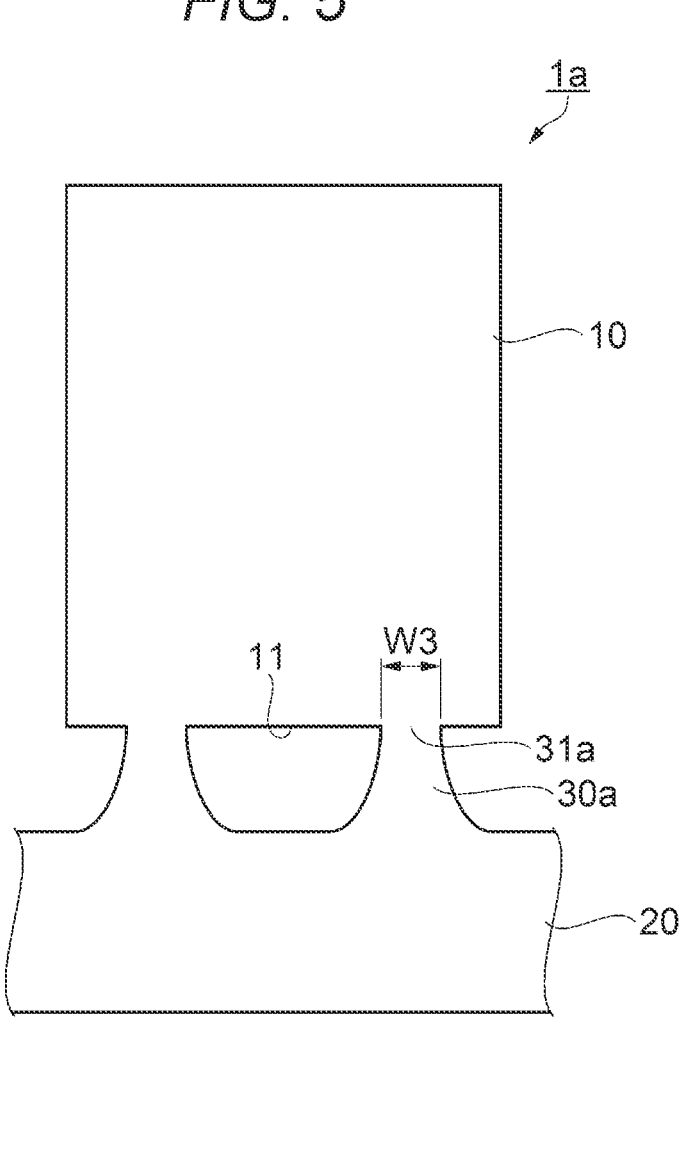
FIG. 5 is a plan view showing a schematic configuration of a resonator element assembly according to a second embodiment.

Next, a resonator element assembly 1a according to a second embodiment will be described with reference to FIG. 5. FIG. 5 is an enlarged view of a position corresponding to a portion A in FIG. 1.

The resonator element assembly 1a according to the present embodiment is the same as the resonator element assembly 1 according to the first embodiment except that a shape of a holding portion 30a is different from that of the resonator element assembly 1 in the first embodiment. Differences from the first embodiment described above will be mainly described, and a description of the same matters will be omitted.

In the resonator element assembly 1a, as shown in FIG. 5, an outer shape of the holding portion 30a has a concave curve line in a plan view, and a width W3 of a narrow portion 31a gradually decreases from the frame portion 20 toward the resonator element 10. A position where the width W3 of the narrow portion 31a is minimum is the end portion 11 of the resonator element 10.

With such a configuration, the stress at the time of breaking off the resonator element 10 from the frame portion 20 is concentrated on the end portion 11 of the resonator element 10 which is a minimum width of the narrow portion 31a, and it is possible to obtain the resonator element 10 with no residue of the holding portion 30a after the breaking off, and it is possible to obtain the same effect as that of the first embodiment.

3. Third Embodiment

Figure 6:
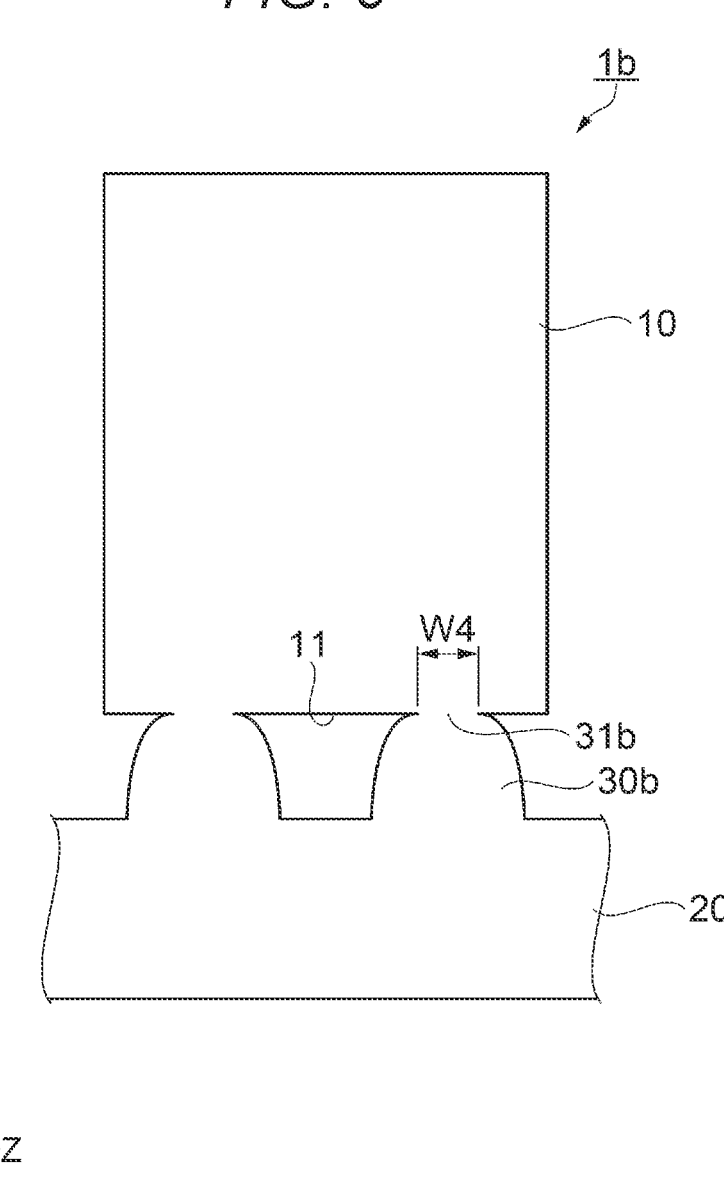
FIG. 6 is a plan view showing a schematic configuration of a resonator element assembly according to a third embodiment.

Next, a resonator element assembly 1b according to a third embodiment will be described with reference to FIG. 6. FIG. 6 is an enlarged view of a position corresponding to the portion A in FIG. 1.

The resonator element assembly 1b according to the present embodiment is the same as the resonator element assembly 1 according to the first embodiment except that a shape of a holding portion 30b is different from that of the resonator element assembly 1 in the first embodiment. Differences from the first embodiment described above will be mainly described, and a description of the same matters will be omitted.

In the resonator element assembly 1b, as shown in FIG. 6, an outer shape of the holding portion 30b has a convex curve line in a plan view, and a width W4 of a narrow portion 31b gradually decreases from the frame portion 20 toward the resonator element 10. A position where the width W4 of the narrow portion 31b is minimum is the end portion 11 of the resonator element 10.

With such a configuration, the stress at the time of breaking off the resonator element 10 from the frame portion 20 is concentrated on the end portion 11 of the resonator element 10 which is a minimum width of the narrow portion 31b, and it is possible to obtain the resonator element 10 with no residue of the holding portion 30b after the breaking off, and it is possible to obtain the same effect as that of the first embodiment.

4. Fourth Embodiment

Figure 7:
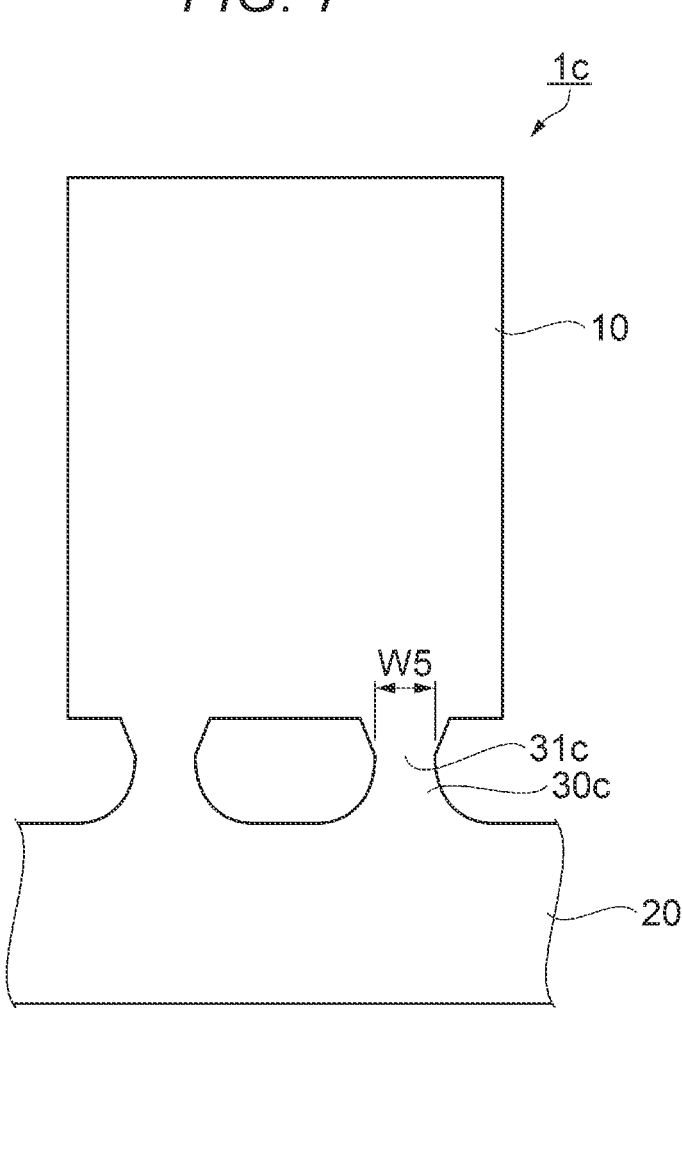
FIG. 7 is a plan view showing a schematic configuration of a resonator element assembly according to a fourth embodiment.

Next, a resonator element assembly 1c according to a fourth embodiment will be described with reference to FIG. 7. FIG. 7 is an enlarged view of a position corresponding to the portion A in FIG. 1.

The resonator element assembly 1c according to the present embodiment is the same as the resonator element assembly 1 according to the first embodiment except that a shape of a holding portion 30c is different from that of the resonator element assembly 1 in the first embodiment. Differences from the first embodiment described above will be mainly described, and a description of the same matters will be omitted.

As shown in FIG. 7, in the resonator element assembly 1c, a width W5 of a narrow portion 31c is minimum at a position closer to the resonator element 10 side than at the center of the holding portion 30c, and an outer shape of the holding portion 30c has a linear portion between the resonator element 10 and a position having the minimum width of the narrow portion 31c in the plan view. The width W5 of the narrow portion 31c gradually decreases in a curved manner from the frame portion 20 toward the position having the minimum width of the narrow portion 31c.

With such a configuration, the stress when the resonator element 10 is broken off from the frame portion 20 is concentrated at the position having the minimum width of the narrow portion 31c, and the same effect as that of the first embodiment can be obtained.

5. Fifth Embodiment

Figure 8:
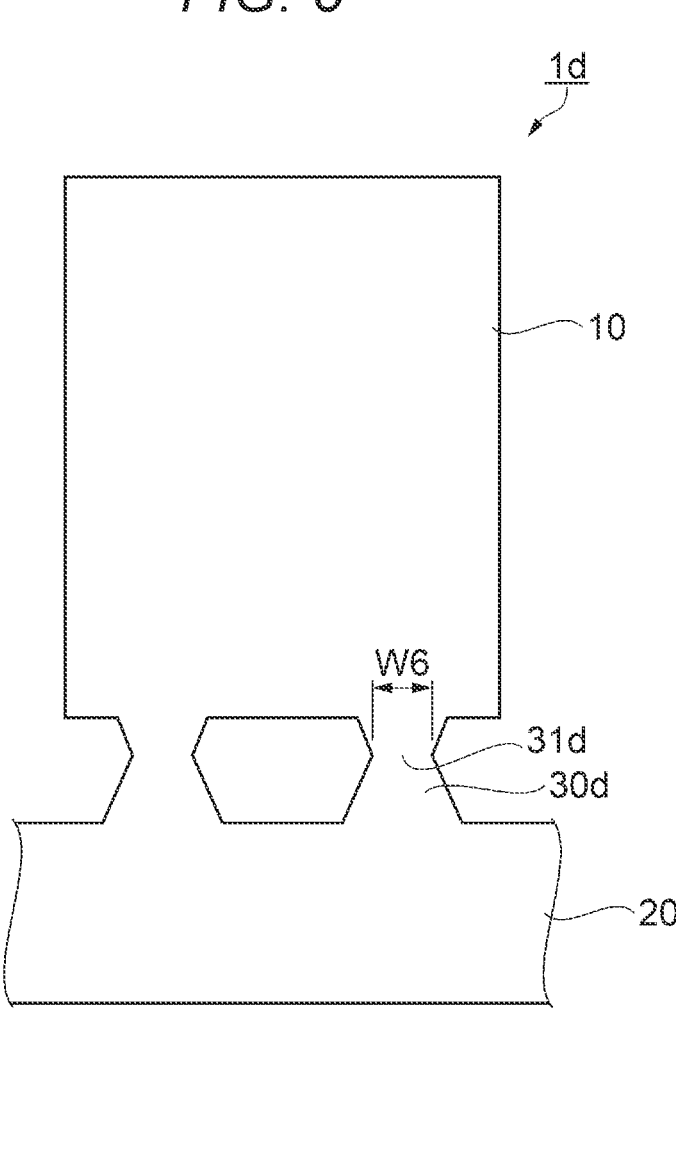
FIG. 8 is a plan view showing a schematic configuration of a resonator element assembly according to a fifth embodiment.

Next, a resonator element assembly 1d according to a fifth embodiment will be described with reference to FIG. 8. FIG. 8 is an enlarged view of a position corresponding to the portion A in FIG. 1.

The resonator element assembly 1d according to the present embodiment is the same as the resonator element assembly 1 according to the first embodiment except that a shape of a holding portion 30d is different from that of the resonator element assembly 1 in the first embodiment. Differences from the first embodiment described above will be mainly described, and a description of the same matters will be omitted.

As shown in FIG. 8, in the resonator element assembly 1d, a width W6 of a narrow portion 31d is minimum at a position closer to the resonator element 10 side than at the center of the holding portion 30d, and an outer shape of the holding portion 30d has a linear portion between the frame portion 20 and a position having the minimum width of the narrow portion 31d in the plan view. The width W6 of the narrow portion 31d linearly and gradually decreases from the resonator element 10 toward the position having the minimum width of the narrow portion 31d.

With such a configuration, the stress when the resonator element 10 is broken off from the frame portion 20 is concentrated at the position having the minimum width of the narrow portion 31d, and the same effect as that of the first embodiment can be obtained.

6. Sixth Embodiment

Figure 9:
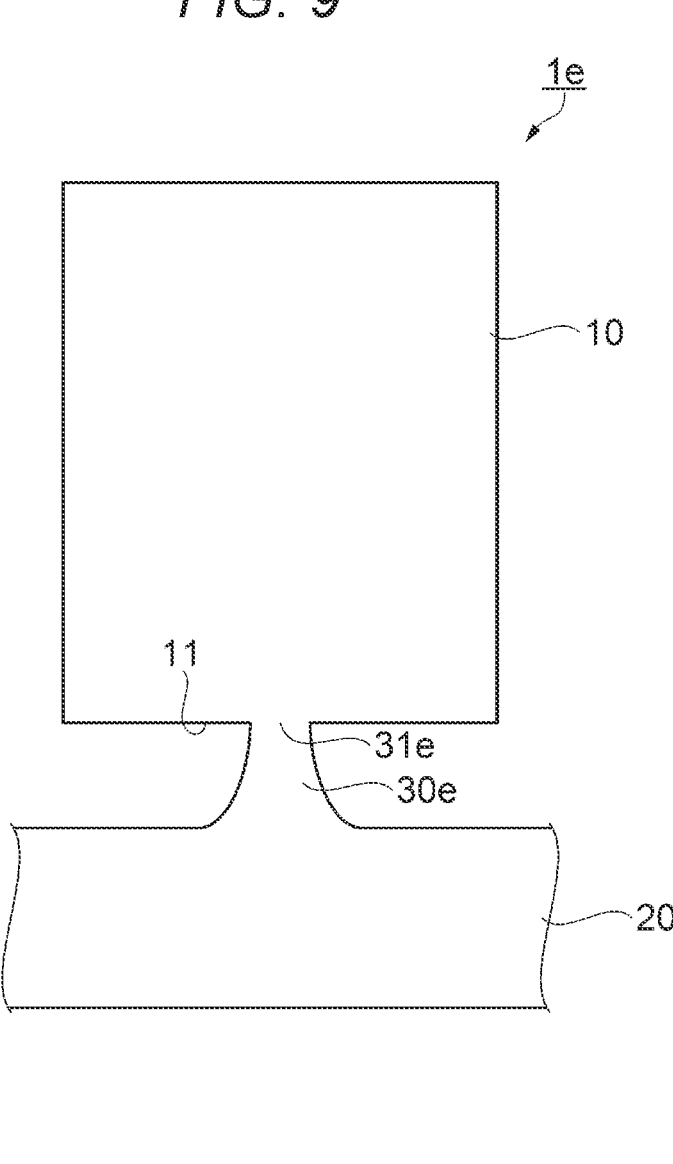
FIG. 9 is a plan view showing a schematic configuration of a resonator element assembly according to a sixth embodiment.

Next, a resonator element assembly 1e according to a sixth embodiment will be described with reference to FIG. 9. FIG. 9 is an enlarged view of a position corresponding to the portion A in FIG. 1.

The resonator element assembly 1e according to the present embodiment is the same as the resonator element assembly 1 according to the first embodiment except that a shape and the number of holding portions 30e are different from those of the resonator element assembly 1 in the first embodiment. Differences from the first embodiment described above will be mainly described, and a description of the same matters will be omitted.

In the resonator element assembly 1e, as shown in FIG. 9, the resonator element 10 is coupled to the frame portion 20 at one or more coupling portions including one holding portion 30e. An outer shape of the holding portion 30e has a concave curve line in a plan view, and a width of a narrow portion 31e gradually decreases from the frame portion 20 toward the resonator element 10. A position where the width of the narrow portion 31e is minimum is the end portion 11 of the resonator element 10.

With such a configuration, the stress at the time of breaking off the resonator element 10 from the frame portion 20 is concentrated on the end portion 11 of the resonator element 10 which is a minimum width of the narrow portion 31e, and the resonator element 10 is more easily broken off since the number of holding portions 30e is one, and the same effect as that of the first embodiment can be obtained.

7. Seventh Embodiment

Figure 10:
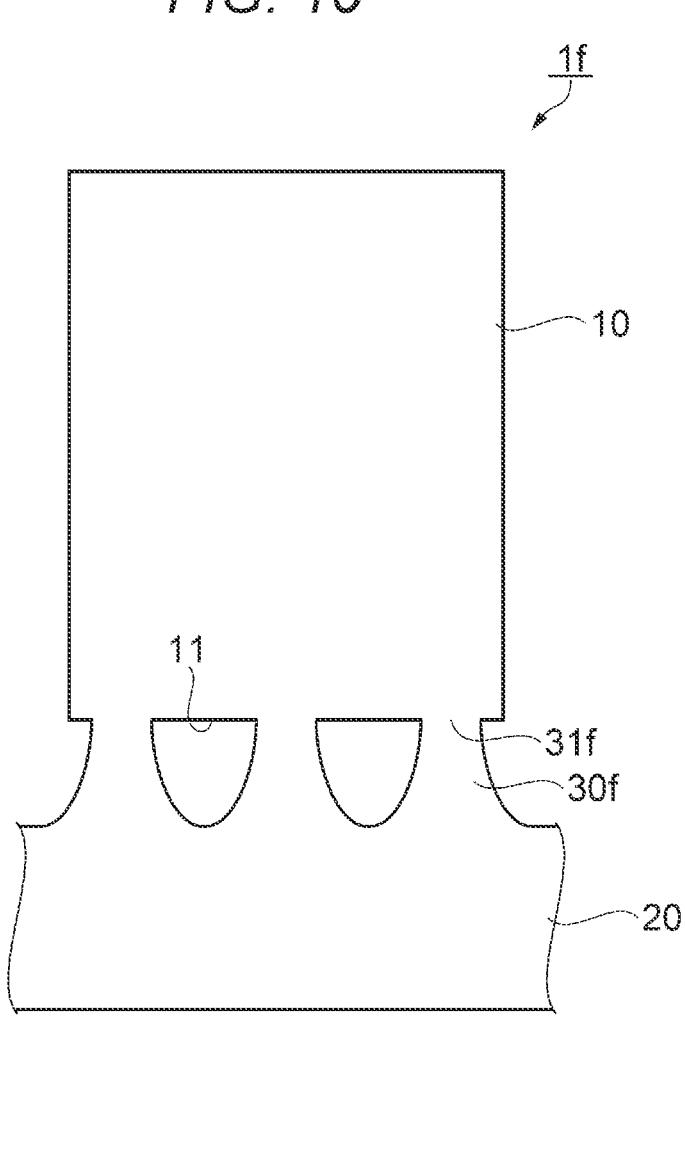
FIG. 10 is a plan view showing a schematic configuration of a resonator element assembly according to a seventh embodiment.

Next, a resonator element assembly 1f according to a seventh embodiment will be described with reference to FIG. 10. FIG. 10 is an enlarged view of a position corresponding to the portion A in FIG. 1.

The resonator element assembly 1f according to the present embodiment is the same as the resonator element assembly 1 according to the first embodiment except that a shape and the number of holding portions 30f are different from those of the resonator element assembly 1 in the first embodiment. Differences from the first embodiment described above will be mainly described, and a description of the same matters will be omitted.

In the resonator element assembly 1f, as shown in FIG. 10, the resonator element 10 is coupled to the frame portion 20 at one or more coupling portions including three holding portions 30f. An outer shape of the holding portion 30f has a concave curve line in a plan view, and a width of a narrow portion 31f gradually decreases from the frame portion 20 toward the resonator element 10. A position where the width of the narrow portion 31f is minimum is the end portion 11 of the resonator element 10.

With such a configuration, a holding strength of the resonator element 10 is increased, and it is possible to reduce detachment of the resonator element 10 from the frame portion 20 during manufacturing the resonator element assembly 1f, and it is possible to obtain the same effect as that of the first embodiment.

What is claimed is:

1. A method for manufacturing a resonator element comprising:
    a substrate preparation step of preparing a substrate;
    an etching step of performing an etching process on the substrate to form a resonator element, a frame portion, and a holding portion that couples the resonator element and the frame portion; and
    a break-off step of breaking off the resonator element from the frame portion, wherein
    the holding portion includes a narrow portion in which a part of a width is narrow, the width of the narrow portion is minimum at a position closer to a resonator element side than at a center of the holding portion,
    in a cross-sectional view, an angle formed by a side surface of the narrow portion with respect to a flat surface of the holding portion is in a range of 85° or more and 95° or less, and
    the etching process is dry etching.

2. The method for manufacturing the resonator element according to claim 1, wherein
    the substrate is formed of an SC cut quartz crystal substrate.

3. The method for manufacturing the resonator element according to claim 1, wherein
    the substrate is formed of an AT cut quartz crystal substrate.

4. The method for manufacturing the resonator element according to claim 1, wherein
    the position at which the width of the narrow portion is minimum is an end portion of the resonator element.

5. The method for manufacturing the resonator element according to claim 1, wherein
    an outer shape of the holding portion has a concave curve line in a plan view, and
    the width of the narrow portion gradually decreases from the frame portion toward the resonator element.

6. The method for manufacturing the resonator element according to claim 1, wherein
    an outer shape of the holding portion has a convex curve line in a plan view, and
    the width of the narrow portion gradually decreases from the frame portion toward the resonator element.

7. The method for manufacturing the resonator element according to claim 1, wherein
    an outer shape of the holding portion has a linear portion between the resonator element and a position having a minimum width in a plan view.

8. The method for manufacturing the resonator element according to claim 1, wherein
    an outer shape of the holding portion has a linear portion between the frame portion and a position having a minimum width in a plan view.

9. The method for manufacturing the resonator element according to claim 1, wherein
    the resonator element and the frame portion are coupled to each other by one or more coupling portions including the holding portion.

10. A resonator element assembly comprising:
    a resonator element;
    a frame portion; and
    a holding portion that couples the resonator element and the frame portion, wherein
    the holding portion includes a narrow portion in which a part of a width is narrow,
    the width of the narrow portion is minimum at a position closer to a resonator element side than at a center of the holding portion, and
    in a cross-sectional view, an angle formed by a side surface of the narrow portion with respect to a flat surface of the holding portion is in a range of 85° or more and 95° or less.

11. The resonator element assembly according to claim 10, wherein
    the resonator element, the frame portion, and the holding portion are formed by dry etching.

12. The resonator element assembly according to claim 10, wherein the resonator element, the frame portion, and the holding portion are formed of an SC cut quartz crystal substrate.

13. The resonator element assembly according to claim 10, wherein the resonator element, the frame portion, and the holding portion are formed of an AT cut quartz crystal substrate.

14. The resonator element assembly according to claim 10, wherein the position at which the width of the holding portion is minimum is an end portion of the resonator element.

* * * * *